United States Patent [19]
Wavish

[11] Patent Number: 5,855,010
[45] Date of Patent: *Dec. 29, 1998

[54] DATA PROCESSING APPARATUS

[75] Inventor: Peter R. Wavish, East Grinstead, England

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 498,280

[22] Filed: Jul. 3, 1995

[30] Foreign Application Priority Data

Jun. 30, 1994 [GB] United Kingdom .................... 9413126

[51] Int. Cl.$^6$ ........................................ G06F 15/18
[52] U.S. Cl. ................... 706/45; 706/53; 706/58
[58] Field of Search ................. 395/50, 10, 60, 395/62, 65, 1, 12; 706/45, 53, 58, 62

[56] References Cited

U.S. PATENT DOCUMENTS

| | | | |
|---|---|---|---|
| 4,754,409 | 6/1988 | Ashford et al. | 364/513 |
| 4,922,430 | 5/1990 | Wavish | 395/90 |
| 5,333,237 | 7/1994 | Stefanopoulos et al. | 395/12 |
| 5,418,887 | 5/1995 | Connah et al. | 706/58 |
| 5,740,085 | 4/1998 | Wavish | 364/578 |

FOREIGN PATENT DOCUMENTS 2261968  6/1993  United Kingdom ............ G06F 15/16

OTHER PUBLICATIONS

Pohl, "Object Oriented Programming Using C++," The Benjamin/Cummings Publishing Company, Inc. pp. 293–298, Dec. 31, 1993.

Bussman et al., "An Agent Model Combining Reactive and Cognitive Capabilities," Intelligent Robots and Systems 1994 Int'l. Conference, vol. 3, pp. 2095–2102, Dec. 31, 1994.

Kosecka et al. "Application of Discrete Events Systems for Modeling and Controlling Robotic Agents," Robotics and Automation, 1994 IEEE Int'l Conference, pp. 2557–2562, Dec. 31, 1994.

Bosco et al. "A Laboratory for AIN Service Design and Validation," Super COMM/ICC '92: Discovering a New World of Communications, Dec. 31, 1992.

"Simulating and Implementing Agents and Multiple Agent Systems", by Michael Graham et al, Proc. European Simulation Multiconference 1991, pp. 226–231.

Primary Examiner—Tariq R. Hafiz
Attorney, Agent, or Firm—Debra K. Stephens; Bernard Franzblau

[57] ABSTRACT

A data processing apparatus comprises apparatus arranged to model a number of modules (302,314) with each module containing a number of interconnected behaviours (320–325). A behaviour identified as a marker (304) is able to access a behaviour (321) within another module via an identify link (306) and from information denoting that behaviour within a look-up table (312) held in a further behaviour (310). Having established access, a direct identify link (316) can be set up between the selected behaviour (321) and a nominated behaviour (318) within the module containing the marker. This direct identify link is maintained when the identify link between the marker and the further behaviour is terminated, allowing the marker to go on and establish other direct links (330) to the internal behaviours of other modules (336).

7 Claims, 6 Drawing Sheets

FIG. 1

| EN | S | Q | INT | SA |
|----|---|---|-----|-----|
| 10 | 1 | 0 | N/A | 100 |
| 18 | 0 | 1 | N/A | 150 |
| 86 | 1 | 0 | N/A | 200 |
| 80 | 0 | 0 | 1 | 250 |
| 92 | 0 | 0 | N/A | 300 |
| 96 | 1 | 0 | N/A | 350 |
| 52 | 0 | 0 | 0 | 400 |
| 24 | 0 | 0 | 1 | 450 |
| 88 | 1 | 0 | N/A | 500 |
| 82 | 0 | 0 | 1 | 550 |
| 98 | 0 | 0 | N/A | 600 |
| 26 | 0 | 0 | 1 | 650 |
| 32 | 0 | 0 | N/A | 700 |
| 90 | 1 | 0 | N/A | 750 |
| 84 | 0 | 0 | 1 | 800 |
| 94 | 0 | 0 | N/A | 850 |
| 38 | 1 | 0 | N/A | 900 |
| 44 | 0 | 0 | 0 | 950 |

DATA PROCESSING APPARATUS

BACKGROUND OF THE INVENTION

The present invention relates to a data processing apparatus for the modelling of virtual machines and having particular, but not exclusive, application to the execution of compiled production rule systems.

The compilation of a production rule system into a representation in the style of a logic circuit is described in Proceedings of the European Simulation Multiconference 1991 at pages 226–231. The production rule system in this example is Real Time ABLE (RTA), where ABLE stands for Agent Behaviour Language which is a highly concurrent production rule language for simulating agents and multiple agent systems. ABLE provides for tighter integration of time with the production rule system. The language may conveniently be compiled into a representation which comprises a number of interconnected elements such as (for virtual logic circuits) AND elements, OR elements, delay elements and so on. RTA uses a propagation technique as opposed to a search strategy to obtain a fast production rule system.

The execution of a compiled production rule system as in asynchronous logic circuit representation has, however, been found to be rather restrictive in terms of the functions that may be performed and this also limits the versatility of the production system. It is therefore an object of the present invention to reduce this restriction.

A further problem which arises is with the connecting together of modules or agents (small sections of virtual circuitry, representations of objects or environments) to enable interaction between them. A known system in which a number of agents may interact with one another to solve problems is described in United Kingdom patent application GB-A-2,261,968 (Toshiba). In the Toshiba system, information about one agent is transmitted through a dedicated control network and stored within another agent to enable that other agent to make decisions on the basis of the stored information without having to communicate. In a dynamic system however, having to rely on stored information is a particular drawback since it may no longer be relevant or accurate by the time it comes to be used. Accordingly, it is a further object of the present invention to avoid the problem of "stale" information by enabling the current internal states of agents to be accessed by other agents.

SUMMARY OF THE INVENTION

In accordance with the present invention there is provided a data processing apparatus comprising means arranged to model a pair of modules with each module comprising a plurality of interconnected elements (behaviours); a further behaviour external to the pair of modules and containing information denoting the behaviours of a first one of the pair of modules; a behaviour within the second of the modules identified as a marker; and means for establishing an identify link between the marker and the external behaviour whereby their states are constrained to be the same, such that the marker is able to access a behaviour within the first module via the identify link and from the information denoting that behaviour within the external behaviour. By the use of the marker and identify link, a simple way is provided for separately loaded and compiled modules to interact with one another dynamically without the requirement for fixed interconnections and the storage of previously supplied data.

Suitably, a memory device arranged as a stack of pointers to behaviours may be provided, with the apparatus being arranged to establish access to the behaviour within the first module by performing the steps of pushing a pointer to the marker onto the stack, dereferencing the identify link to replace the pointer to the marker with a pointer to the external behaviour, and indexing the external behaviour information to replace the pointer to the external behaviour in the stack with a pointer to the selected behaviour of the first module.

Means operable to establish a further identify link between the selected behaviour of the first module and a nominated behaviour within the module containing the marker may be provided such as to allow direct linking of the modules once the connection has been established by the marker and through the external behaviour. This further identify link would suitably be maintained when the identify link between the marker and the external behaviour is terminated to allow the marker to begin establishing links to another module. Termination of the further identify link may occur when the constraint behaviour turns off as a result of a system command or may be set to occur when either of the selected behaviour of the first module or the nominated behaviour of the module containing the marker becomes subject to a subsequently asserted identify link.

A direct connection from marker to external behaviour is not mandatory and means may be provided for establishing a link as a point-to-point link via one or more further behaviours by asserting successive identify links between each. In the dereferencing step referred to above, the pointers are successively replaced until the pointer to the external behaviour is arrived at.

BRIEF DESCRIPTION OF THE DRAWING

The present invention will now be described, with particular reference to the modelling of asynchronous logic circuits and by way of example only, with reference to the accompanying drawings, in which.

DESCRIPTION OF THE PREFERRED EMBODIMENTS

Figure 1:
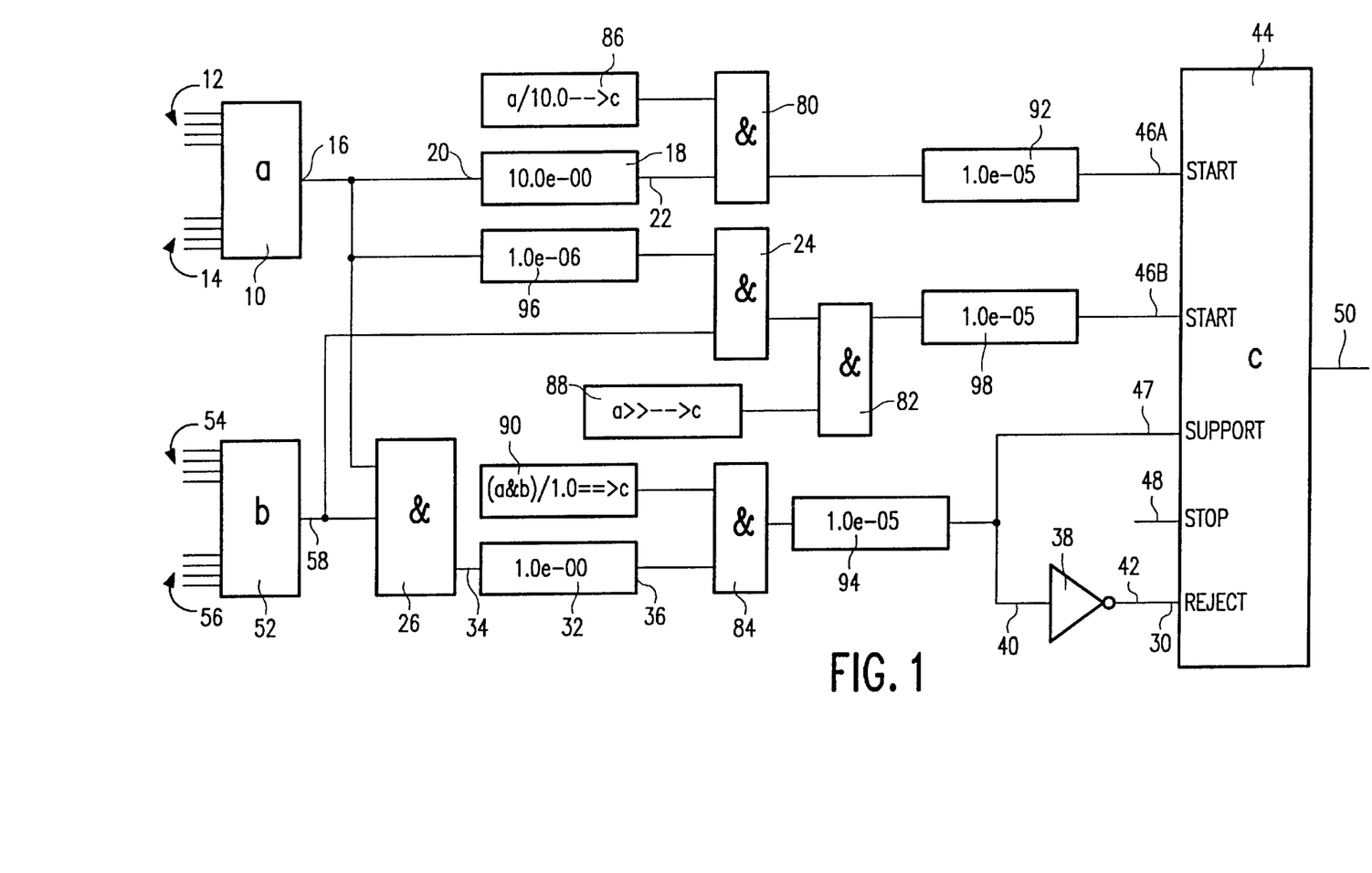
FIG. 1 is a logic representation of a production rule system.

FIG. 1 shows a logic representation of an asynchronous logic circuit compiled from a simple RTA system. Three simple behaviours (registers) a,b,c are combined in three different rules, represented at 86,88 and 90, with the rule functions being implemented by combinations of logic functions and time annotations (delay elements). The Figure is a simple implementation with each of the rules having a state change for behaviour c defining the response such that the general propagation through the circuit of state changes is from left to right. In a more complex implementation, for example where behaviour c formed part of the condition portion of a rule having behaviour b defining the response, there would be state change propagation additionally from right to left of the Figure (from c to b).

In the implementation of FIG. 1, register 10 (behaviour a) has a plurality of independent start or support inputs 12, a plurality of independent stop or reject inputs 14 (the difference between start and support and between stop and reject is discussed below) and an output 16. The output 16 is respectively connected to the input 20 of a first delay element 18, via a short (1 microsecond) delay element 96 to a first input of an AND element 24, and to a first input of an AND element 26. The delay element 18 sets a delay of 10.0 seconds (although it will be readily appreciated that other units of time may be used) such that the output of the element 18 will be turned on 10 seconds after the input is turned on: the output will however be turned off at the instant the input is turned off. The output 22 of the delay element 18 is combined with rule function 86 at AND element 80 (as is required by RTA) and, through a delay element 92 is connected to a first start input 46A of a register 44 (behaviour c). The register 44 has an output 50. The delay of element 92 (suitably 10 microseconds) is provided to allow the state to settle before being read.

A further register 52 (behaviour b) has a plurality of start or support inputs 54, a plurality of stop or reject inputs 56 and an output 58. The output 58 is connected to second inputs of each of the AND elements 24 and 26. The output of AND element 24 is combined with rule function 88 at AND element 82 and from there via a delay element 98 (again to allow the state to settle before being read) to a further start input 46B of the register 44. The AND element 26 has an output connected to the input 34 of a further delay element 32 having a delay of 1.0 second. The output 36 of the delay element 32 is combined with rule function 90 at AND element 84 and, via a delay element (again to allow the state to settle before being read), is connected to support input 47 of the register 44 and to the input 40 of an inverter 38. The inverter 38 has an output 42 connected to a reject input 30 of the register 44.

The system of FIG. 1 embodies the following RTA program rules:

$$a/10.0 \rightarrow c \quad (1)$$

$$(a\& b)/1.0 \rightarrow c \quad (2)$$

$$(a>>b \rightarrow c \quad (3)$$

(1) and (3) are examples of a type of rule called a licence. (1) has the effect of setting the status of register 44 (behaviour c) if the status of register 10 (behaviour a) has been set continuously for 10 seconds. In FIG. 1 this licence is effected by the delay 18 connected between the register 10 and one of the start inputs 46A of the register 44. (3) is an AND_THEN licence requiring the status of register 10 to be presented before the status of register 52.

(2) is a type of rule called a schema which is similar to a licence but which provides the additional effect that as soon as the conditions which satisfied the schema no longer exist then the consequence of the schema is retracted. In this example, the status of the register 44 (behaviour c) is set if the outputs of register 10 and 52 (behaviours a and b) are both set continuously for 1.0 second. This effect is provided by the output of the AND element 26 being coupled via the delay element 32 to the support input 47 of the register 44. However, the status of the register 44 must also be reset if either the status of register 10 or the status of the register 52 is reset. This effect is achieved by the inverter 38 connected between the output of the AND element 26 and the reject input 48 of the register 44.

The elements of the representation can be regarded as edge-triggered by virtue of the propagating or forward-chaining nature of the apparatus. The inputs to register elements 10,52 and the output of the register element 44 are generally connected to further sections of a larger asynchronous logic representation.

Figure 2:
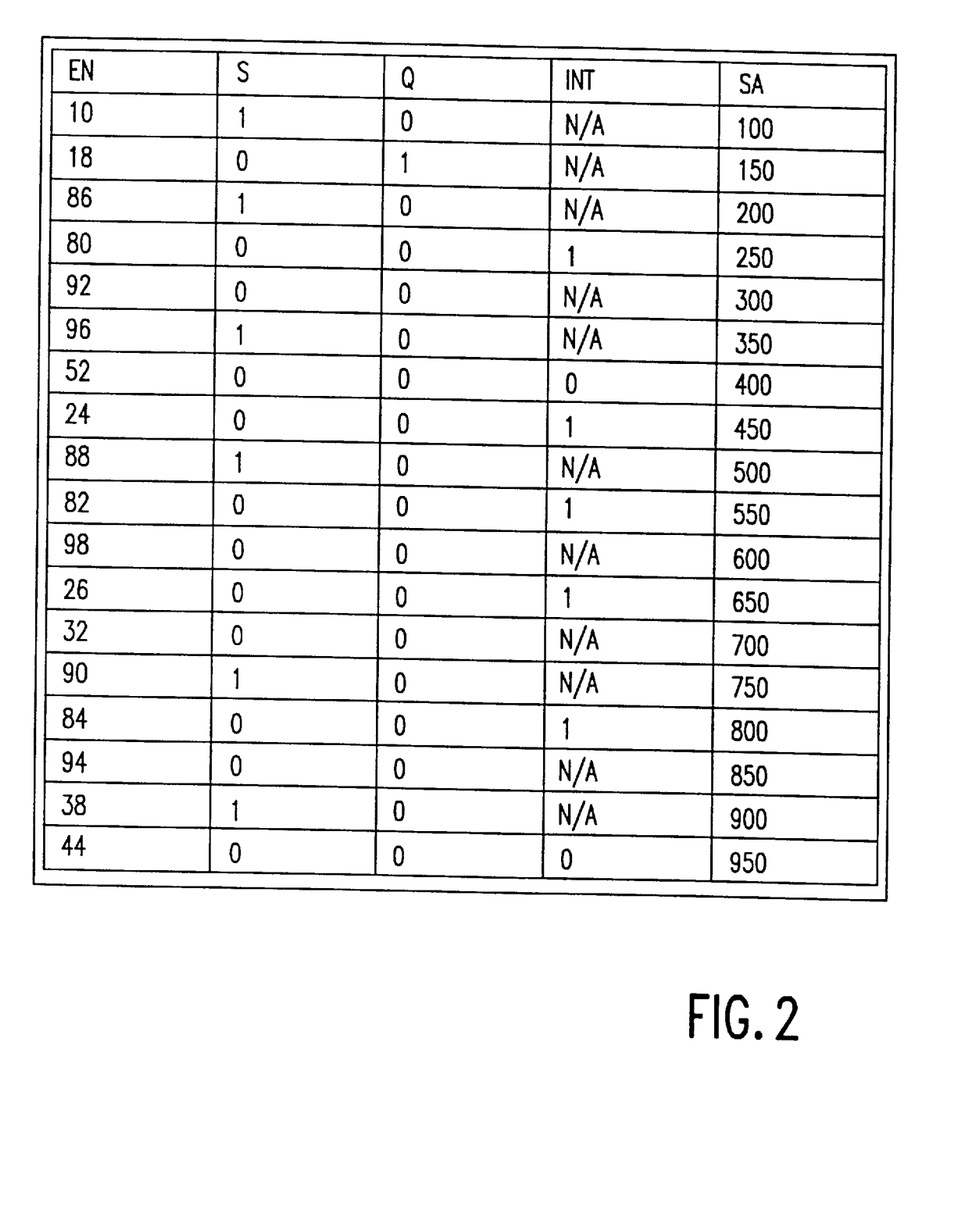
FIG. 2 is a table illustrating a representation of the system of FIG. 1.

Such a logic representation may be stored in an apparatus in accordance with the present invention in the form of a table as shown in FIG. 2. Each of the register elements (behaviours) 10,52,44, delay elements (time annotations) 18,32,92,94,96,98, logic function elements 24,26,38,80,82, 84, and rule functions 86,88,90 shown in FIG. 1 has a row in the table. Each row in the table identifies the element number EN (for the sake of clarity the reference numerals of the elements as they appear in FIG. 1 are used), a status flag S of the device, a queued status flag Q of the device (as will be explained), the internal status INT, and a propagate function start address SA. When the status of the device to which the row of the table relates (the originating or host device) changes, a propagate function is executed to effect any appropriate changes to all of the elements which may be affected by such a change. These propagate functions are conveniently arranged at certain memory locations or start addresses SA. Changing the status of elements by propagation in such a manner rather than by searching for all of the elements affected by a change of status allows the apparatus to operate efficiently.

The behaviour of the system as viewed from the inputs of register 44 may be specified as follows:

---

BEHAVIOUR c (YES)
START:
    DELAY 1.0e−05 seconds (NO)
        AND (NO)
            LICENCE (a)/10.0—>c (YES)
            DELAY 10.0 seconds (NO)
                BEHAVIOUR a (YES)
    DELAY 1.0e−05 seconds (NO)
        AND (NO)
            LICENCE a>>b—>c (YES)
            AND THEN (NO)
                DELAY 1.0e−06 seconds (NO)
                    BEHAVIOUR a (YES)
                BEHAVIOUR b (YES)
STOP:
    TERMINAL (NO)
SUPPORT:
    DELAY 1.0e−05 seconds (NO)
        AND (NO)
            SCHEMA (a&b)/1.0==>c (YES)
            DELAY 1.0 seconds (NO)
            AND (YES)
                BEHAVIOUR a (YES)
                BEHAVIOUR b (YES)
REJECT:
    NOT (YES)
        DELAY 1.0e−05 seconds (NO)
            AND (NO)
                SCHEMA (a&b)/1.0==>c (YES)
                DELAY 1.0 seconds (NO)
                AND (YES)
                    BEHAVIOUR a (YES)
                    BEHAVIOUR b (YES)

---

As can be seen, the differentiation between inputs as start or support (and also stop or reject) depends on whether they receive the result of a schema. Inputs 46A and 46B are start inputs as they receive the result of a licence whilst support input 47 receives the result of the schema. The AND element 24 of FIG. 1 is shown functioning as an AND_THEN element (like an AND element but requiring the inputs to be presented in a particular order), with additional delay 96 ensuring the correct order of receipt from register 10 and 52.

Figure 3:
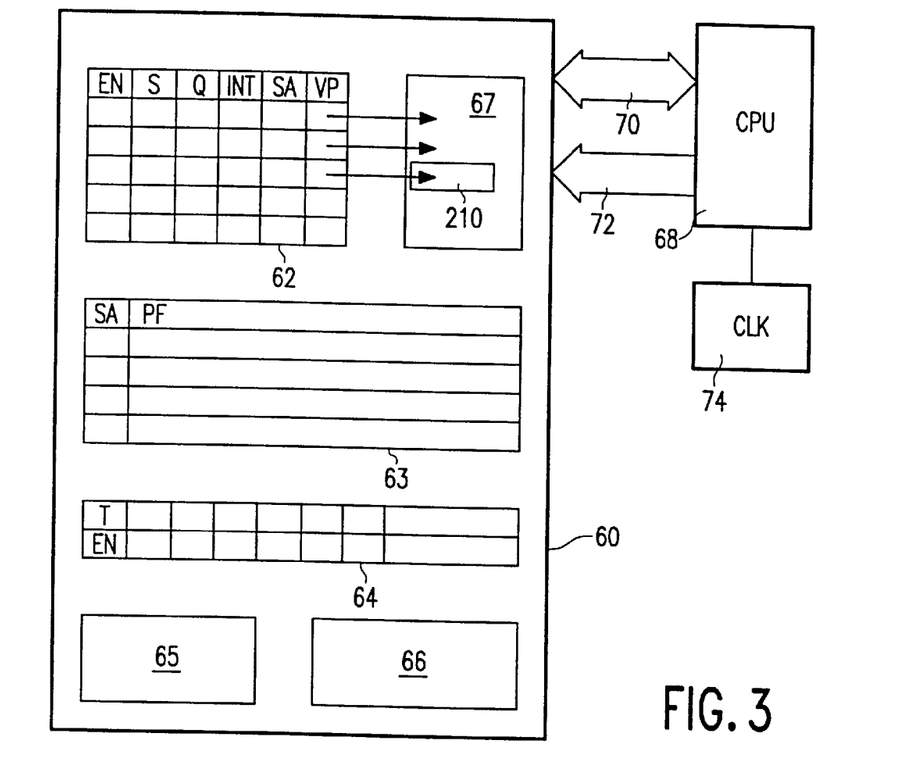
FIG. 3 is a block schematic diagram of a data processing apparatus in accordance with the present invention.

FIG. 3 is a block schematic diagram of a data processing apparatus embodying the invention. A random access memory (RAM) 60 comprises a storage means 62 containing the element number EN, state S, queued status Q and propagate function start addresses SA as described with reference to FIG. 2. A further column VP in storage means 62 provides, for each of the elements, a location for element data which may comprise a pointer to constraint information in a further storage area 67 as will be described in greater detail below.

The propagate functions PF starting at the start addresses are stored in another storage means (area of RAM) 63. The RAM 60 also comprises further storage means 64 for storing future element state changes, an event stack 65, and a program store 66. The program store and the propagate functions could, if desired, be stored in another memory device, for example a read only memory. The RAM 60 is connected to a central processing unit (CPU) 68 by a data bus 70 and an address bus 72 in known manner. Also in known manner, a clock (CLK) 74 is connected to the CPU 68.

The further storage means 64 for future element state changes is arranged as a two row table containing a plurality of time periods T and element numbers EN. Any number of elements numbers EN can be stored to correspond to a particular time period T and the states of these elements will all be changed during that time period.

Generally, all element state changes except those corresponding to delay elements will be executed in the current time period although other element state changes also can be delayed if desired. Those element state changes which are to occur without a time delay may be placed in the event stack 65 (FIG. 3) for execution in the near future i.e. later in the current time period, but before moving to the next time period for which an event is specified.

Figure 4:
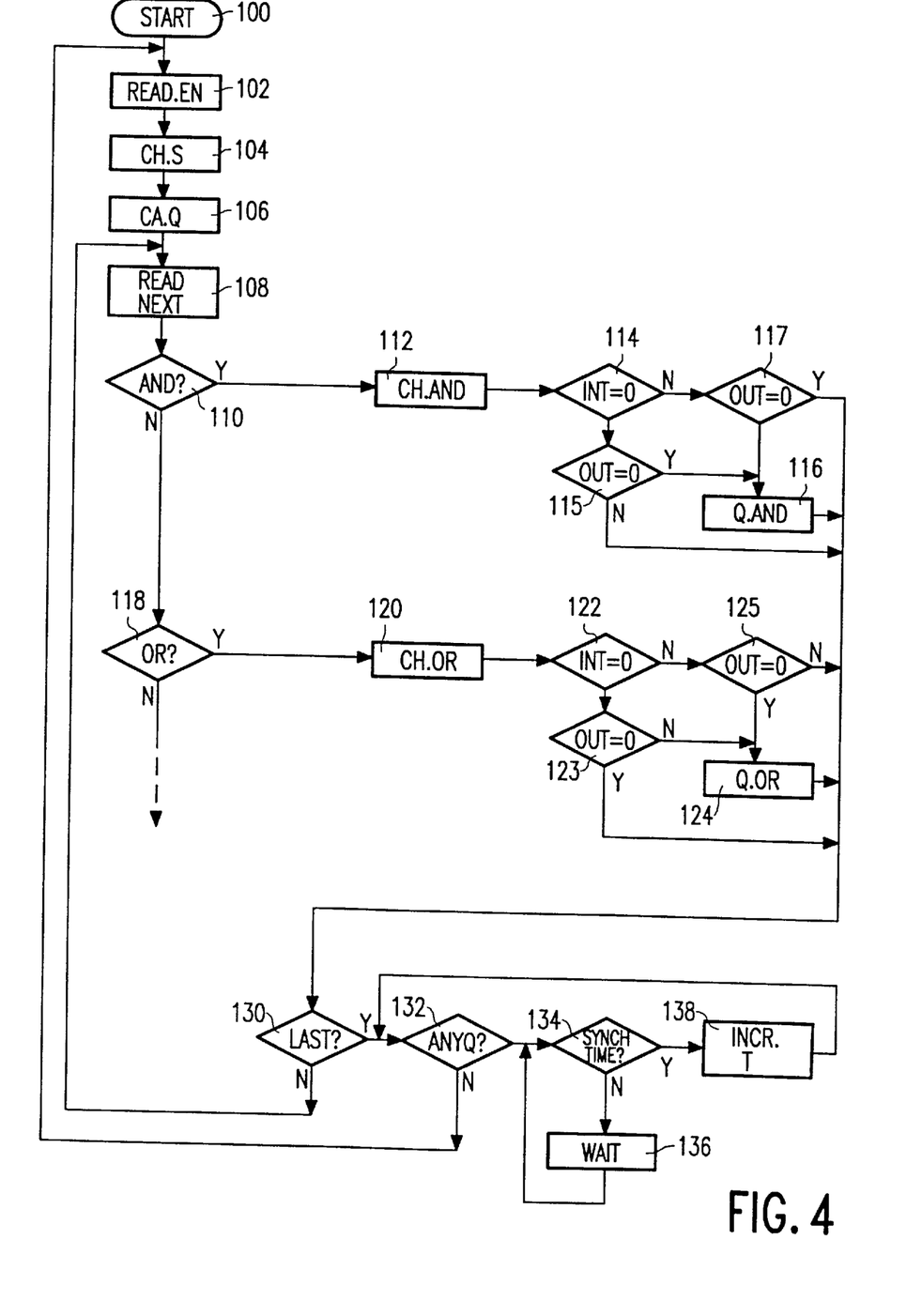
FIG. 4 is a flow chart illustrating the steps carried out by the processor of FIG. 3.

The program store 66 contains the instructions which are performed by the CPU 68 to carry out the changes of device state stored in the memory 62 and to determine the device state changes consequent upon them. FIG. 4 shows a flow chart for the operation of the CPU 68 in accordance with instructions stored in the program store 66. The numbered steps in the flow chart have the following functions.

100 - START
102 - read element number EN of host element (where provided from memory 64
104 - change external state S of host element
106 - cancel queued status Q of host element
108 - read next item from propagate function of host element
110 - Is the item an AND function?
112 - alter internal state of specified AND element, decrement if host element state change is from off to on, and increment if from on to off
114 - Is internal state of the AND device O?
115 - Is output state of the AND device O?
116 - queue a change of output state of the AND element and set queued flag of AND element
117 - Is output state of the AND device O?
118 - Is the item an OR function?
120 - alter internal state of specified OR element, increment if host element state change is from off to on, and vice versa
122 - Is internal state of OR element O?
123 - Is output state of OR element O?
124 - queue a change of output state of the OR element and set queued flag of OR element
125 - Is output state of the OR device O?
130 - Is the present item the last one in the propagation function of the host element?
132 - Are there any further elements listed in the event queue at the present time (or in the event stack, if present)
134 - has sufficient time elapsed during present time period for system to be synchronised with real time
136 - wait a short time
138 - Increment short period T The routine of FIG. 4 operates as follows. An item is read from the memory 64 at step 102 and the relevant element output state S and its queued state Q are updated at steps 104,106. The next item in the propagate function for the element is then read from the relevant PF portion of the memory 63. If the item is an AND function the internal state of the specified AND element is altered. The internal state of an AND element is equal to the number of inputs to that element which are off or logical zero. Accordingly when the internal state of the element is zero, the AND function is satisfied and the output state should be on or logical one. If the change of state of the host element that was effected at step 104 was to turn the host element on (or a change from logical 0 to logical 1) then the internal state of an AND element in its propagation function is reduced by 1. Conversely if the change of state that was effected at step 104 was to turn the host element off (or a change from logical 1 to logical 0) then the internal state of an AND element specified in its propagation function is increased by 1. The crucial internal state changes for an AND element are from 0 to 1 and from 1 to 0. If either of these changes occurs then the output state of the element should change accordingly. The change in output state is not effected immediately to avoid clashes within the apparatus but is queued for future execution in the same time interval. The queued status Q of the element is turned on or set to logical 1 in the memory 62.

Figure 5:
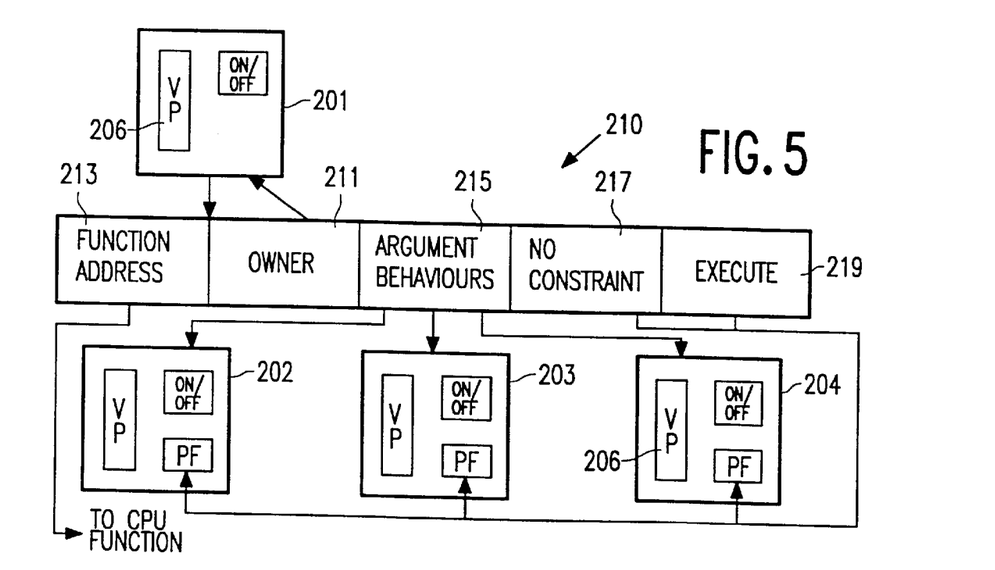
FIG. 5 schematically illustrates operation of a section of the constraint data area of the memory of FIG. 3.

If the item read from the PF in memory 62 is an OR element the internal state of the specified OR element is altered accordingly. If the change of state of the host element at step 104 was to turn the host element on then the internal state of the OR element is increased by 1. Again the important internal state changes are from 0 to 1 and 1 to 0 but the consequences for the output state of the device are reversed: the change in internal state from 0 to 1 makes the output state 1, and the change from 1 to 0 makes the output state 0. Again the actual change of state is placed in the queue in memory 64 for execution in the next time period. The remaining steps of the flow chart of FIG. 5 provide for checking of the event queue and allowing for synchronisation as will be readily understandable from the above.

Element propagate functions may further comprise the following instructions which may be placed in the PF memory and effectively added to the flow chart of FIG. 5 below step 118 (i.e. following determination that the function is neither AND nor OR). These are listed below in terms of their effect if the host element has turned on or off.

If the host element to which the propagate function is attached turns ON:

| | |
|---|---|
| start_behaviour | turns the specified element output on after 1 time unit |
| support_behaviour | turns the specified element output on after 1 time unit depending on the internal state |
| stop_behaviour | turns the specified element output off after 1 time unit |
| reject_behaviour | turns the specified element output off after 1 time unit depending on the internal state |
| delay | turns the specified delay element output on after a specified number of time units |
| AND | decreased internal state of specified AND element and turn output state on if internal state = 0 |
| AND_THEN_left | enables the AND_THEN element by setting an internal state bit in that element |
| AND_THEN_right | turns the AND_THEN element on if it is enabled |
| NOT | turns the output of the NOT element (invertor) off. |
| finish | stops executing the current propagate function and starts executing the propagate function belonging to the next element listed in the present time period or event queue (when present) |
| constraint | creates a new constraint instance |
| no_constraint | no effect |
| execute | executes a constraint CPU routine |
| TLU | add the weight specified in the TLU instruction to the internal state of the specified TLU element. If internal state rises above/falls below threshold then turn output state on/off. |

If the host element to which the propagate function is attached turns OFF:

| | |
|---|---|
| start_behaviour | no effect |
| support_behaviour | no effect |
| stop_behaviour | no effect |
| reject_behaviour | no effect |
| delay | turns the specified delay element output off immediately |
| AND_THEN_left | disables the specified AND_THEN element by clearing the internal state bit |
| AND_THEN_right | turns the AND_THEN element off |
| NOT | turns the output of the NOT element on |
| finish | stops executing the current propagate function and starts executing the propagate function belonging to the next element listed in the present time period or event queue (where present) |
| constraint | remove constraint data block and associated no_constraint and execute instructions |
| no_constraint | remove constraint data block and associated no_constraint and execute instructions |
| execute | executes constraint CPU function |
| TLU | subtract the weight specified in the TLU instruction from the internal state of the specified TLU element. If internal state rises above/falls below threshold then turn output state on/off |

The constraint, no_constraint, and execute instructions will now be further explained.

Referring to FIG. 5, to provide for constraints, each of the behaviours 201–204 (register function elements) has a pointer 206 to a value VP which can be any data type supported by the CPU. In the following, it is assumed that the CPU (68, FIG. 3) supports C and accordingly references to C coding and C functions should be construed accordingly.

The system is provided with a FILO stack of pointers (300, FIG. 7) to behaviours which is used to hold the arguments of C functions with various instructions as will be given below being provided to manipulate the stack. The C functions can operate on the values of argument behaviours by, amongst others, separating them from behaviours in which they appear.

Returning to FIG. 5, when the constraint instruction is executed as a result of the behaviour 201 representing the constraint turning on, it causes a block 210 of the constraint data memory (67, FIG. 3) to be allocated to hold the constraint data. This block is filled with at least a pointer 211 to the behaviour 201 which owns it; the address 213 of the C function; a set 215 of argument behaviours 202–204 for the C function; a set 217 of no_constraint instructions; and a set 219 of execute instructions. The no_constraint instructions 219 are linked into the propagate functions PF of behaviours 202–204 representing the modules containing the argument behaviours so that a no_constraint instruction is executed to remove the constraint whenever a module is unloaded and hence the argument behaviour it contains disappears. The execute instructions 219 are also linked into the propagate functions PF of argument behaviours 202–204 so that when an argument behaviour changes state (on to off, or off to on) the constraint C function addressed at 213 is called. This C function is also called when an argument behaviour blinks, that is to say when the behaviour state instantaneously changes on-off-on again or off-on-off again.

When the constraint instruction turns off, the no_constraint and execute instructions are unthreaded from the behaviour propagate functions and the whole constraint data block 210 is deleted from memory area 67. Executing a no_constraint instruction turns off the constraint behaviour 201 thereby freeing the constraint data block 210 as above. It will be appreciated that the constraint is only enforced when the constraint behaviour 201 is on. The arguments 202–204 of the behaviour are evaluated once when the constraint turns on and their values are frozen into the constraint data block 210. Executing an execute instruction causes the C function to be called with the arguments specified in the constraint data block.

There are no fixed rules for the coding of the constraint C function but it must be written to be sensitive to the particular reason why it was executed, for example whether it was the result of the constraint being created or as a result of the particular argument changing state. Some degree of commonality may be introduced by specifying rules for dealing with regularly encountered constraint features. For example, where the constraint links several behaviours, the argument value to be altered to maintain the validity of the constraint may be chosen always to be the highest argument value if it was not a change in that which initiated the alteration. It may be convenient to give a programmer access to the constraint behaviour 201 itself as well as its arguments. This may be done by passing it as an extra argument to the C function.

Whilst preferred, no specific provision need be made for controlling the propagation of changes through constraints. Propagation control can be achieved, however, by masks which filter out incoming and outgoing changes on particular arguments. In the most degenerate case, when all the arguments are masked off, the constraint C function is executed only when the constraint is first applied, regardless of how its arguments change subsequently. This in effect provides an external function call mechanism.

Figure 6:
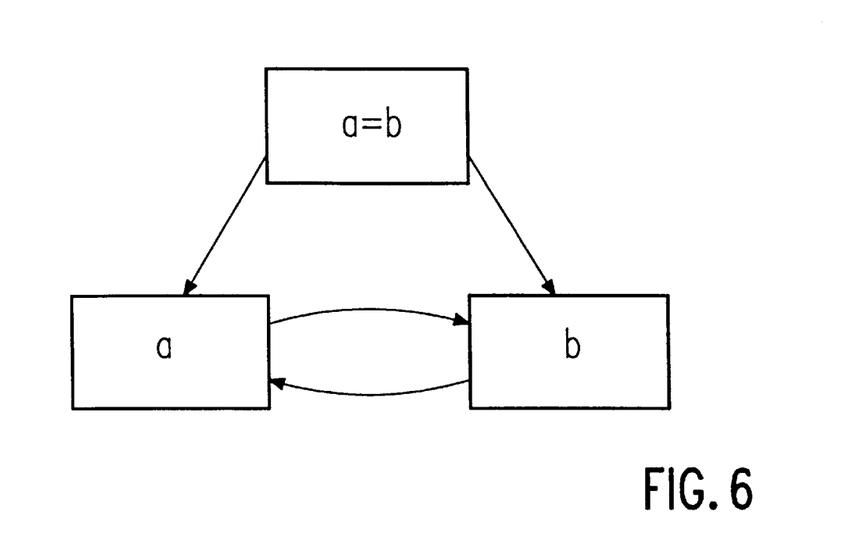
FIG. 6 schematically represents an equivalence constraint.

An example of a constraint is an equivalence or identify constraint as represented by FIG. 6. The identify constraint C function copies the state of its incoming argument behaviour (a) to the other argument behaviour (b), so ensuring that changes can propagate in either direction through the constraint and that the state of the two behaviours are linked (i.e.

maintained to be the same). Other forms of constraint include algebraic where for example the constraint may maintain the data value or output of a first register function element to be equal to the sum of the data values or outputs of two other register function elements. Boolean constraints maintaining the output of a register function element to be the result of a logical operation on the outputs of other register function elements are also possible.

The propagate function for a device may be stored remote from the memory 60, and the SA portion of memory 62 then contains the address of the relevant portion of memory. This is especially useful if the propagate functions are large or duplicated. The probability of two devices having identical propagate functions increases with the size of the system. To exploit such duplication, the propagate function may be arranged to specify target elements by use of relative addressing.

Such systems may be arranged to support a number of different groupings of modules (worlds) each world having its own event queue and time line and being interconnected by use of identifying (equivalence) constraints as will now be described with reference to FIGS. 7 and 8.

In a first module 302 (a group of agents), a first behaviour 304 is a marker forming the basis for communication by the module with other modules. An identify constraint 306 is asserted by a constraint behaviour 308 between the marker 304 and a further behaviour 310 such that their states (on or off) are maintained to be the same by propagating changes in one to the other. The further behaviour 310 will be referred to hereinafter as the "external" behaviour as it is outside of the modules to be considered, although it will be within a further module (not shown) in practice. The marker 304 may be linked by an identify constraint to only a single further behaviour at a time and holds a pointer in its data field VP to the behaviour with which it is identified.

Figure 7:
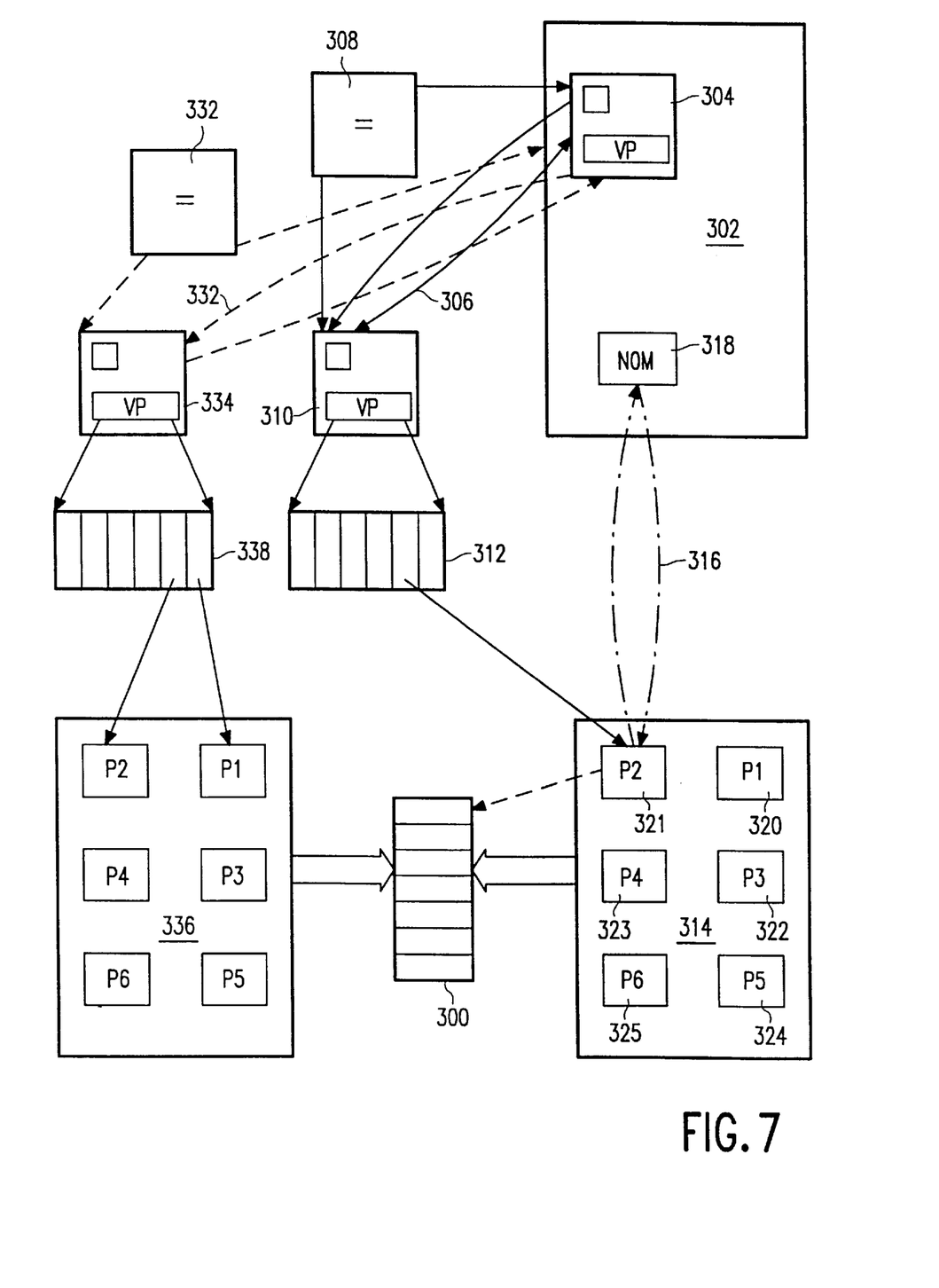
FIG. 7 schematically represents the linking of behaviours from separate modules.
Figure 8:
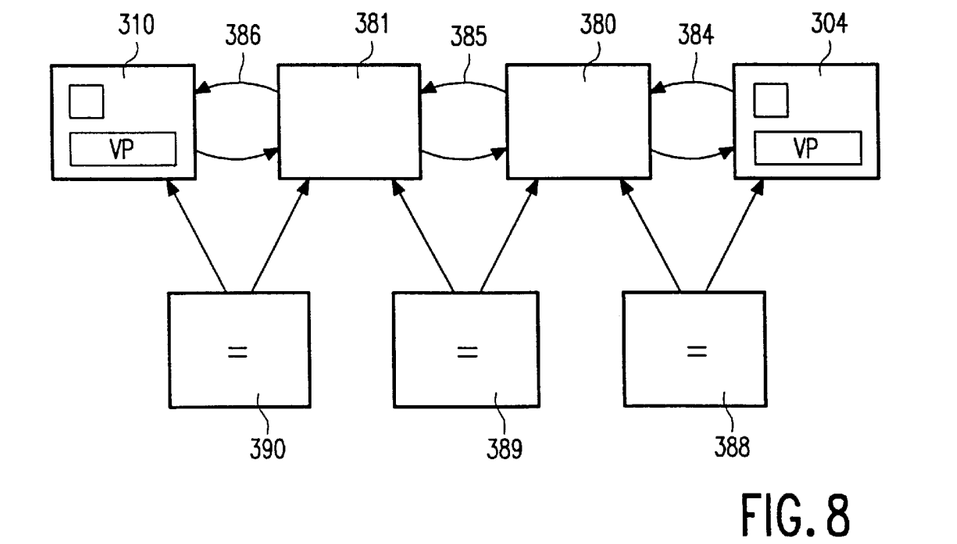
FIG. 8 shows an extension to a part of the representation of FIG. 7.

The marker 304 may be directly identified with the external behaviour 310 as shown in FIG. 7 or, as in FIG. 8, the identification may be indirect with a number of behaviours 380,381 lying between is them and separate identify constraints 384–386 (asserted by constraint behaviours 388–390) providing the linkage.

Within its data field VP, the external behaviour 310 contains a look-up table 312 containing the behaviours 320–325 in a further module 314 with which the external behaviour 310 is associated. As will be appreciated, by use of the marker 304 via the identify link 306 to the external behaviour 310, and with knowledge of a numerical index identifying entries in the look-up table 312, a selected behaviour (e.g. behaviour 321) within module 314 can be located from within module 302.

Having located the selected behaviour 321, a pointer to which is placed in FILO pointer stack 300, a more direct link may be created by asserting a further identify constraint 316 to identify the selected behaviour 321 with a nominated behaviour 318 within the originating module 302. Alternatively, the selected behaviour may be used as the argument of a further constraint C function as previously described.

A marker may establish links with other modules successively (although only one established link is permitted at a time for each marker) by means of an extension to identify behaviours, the arguments of which are evaluated when the identify behaviour turns on. A pair of behaviours identified with one another are not specified absolutely as has been the case with earlier versions of RTA, but instead are specified in terms of a small set of operators implemented as the following instructions:

| | |
|---|---|
| push_index | index behaviour in module on top of stack |
| push | push given behaviour onto stack |
| pop | remove behaviour(s) from stack |
| deref_fully | replace with end of chain of identifys |
| deref_once | replace with next in chain of identifys |

These instructions operate on the pointer stack 300 to set up the behaviours used as arguments in the identify constraint external C functions. The deref_fully instruction will normally be used in preference to the deref_once: in the arrangement of FIG. 8, fully dereferencing the marker 304 will bring up the pointer to the external behaviour 310 whereas dereferencing once will only bring up intermediate behaviour 380. In the example described with reference to FIG. 7, the sequence of instructions would be:

| | |
|---|---|
| push_marker | a pointer to the marker 302 is placed on the stack 300 |
| deref_fully_marker | following establishment of the identify link to the external behaviour 310, the pointer to the marker is replaced on top of the stack by a pointer to the external behaviour 310 |
| push_index_2 | a pointer to the behaviour identified in the look-up table of the external behaviour as entry 2 (in this case behaviour 321) is placed on top of the stack |

As mentioned above, these instructions are executed when identify behaviours turn on in order to identify which behaviours should be identified. The same two behaviours (selected behaviour 321 and nominated local behaviour 318) continue to be identified even if the markers accessed during dereferencing subsequently change position. Thus, behaviours 318 and 321 will remain identified following termination of the identify link 306, enabling a further identify link (dashed line 330) asserted by constraint behaviour 332 to be established with a further external behaviour 334. Since in many cases the layout of modules is identical, as is assumed for module 336 associated with the external behaviour 334 and the previous module 314, the knowledge of indexing of the external behaviour look-up table 338 is the same as for look-up table 312 and need not be duplicated.

By use of markers and identify links, the present invention provides a convenient way for modules to interact with each other in a dynamically changing way without requiring the interconnections to be explicitly defined as the modules are compiled. Additionally, the present invention addresses the problem of representing multiple modules (agents) by name within a propositional logic system which is combinatorially explosive. By making the behaviour of a module relative to its markers, the same logic network within the module may be applied to large numbers of other modules at low cost.

From reading the present disclosure, other modifications will be apparent to persons skilled in the art. Such modifications may involve other features which are already known in the field of data processing apparatuses and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention.

What is claimed is:

1. A data processing apparatus comprising: means arranged to model an asynchronous logic circuit as a plurality of circuit elements (behaviours) each having a respective internal state and the functions of which are governed by a set of rules each defining a response to a given condition and the apparatus comprising means for responding to any said condition being satisfied by generating the associated response, said logic circuit including a pair of modules with each module comprising a plurality of interconnected behaviors; a further behaviour external to the pair of modules and containing information denoting the behaviours of a first one of the pair of modules; a behaviour within the second of the modules identified as a marker; and means for establishing an identify link between the marker and the external behaviour whereby said respective internal states are constrained to be the same, such that the marker is able to access a behaviour within the first module via the identify link and from the information denoting that behaviour within the external behaviour.

2. A data processing apparatus comprising: means arranged to model a pair of modules with each module comprising a plurality of interconnected elements (behaviours); a further behaviour external to the pair of modules and containing information denoting the behaviours of a first one of the pair of modules; a behaviour within the second of the modules identified as a marker; means for establishing an identify link between the marker and the external behaviour whereby their states are constrained to be the same, such that the marker is able to access a behaviour within the first module via the identify link and from the information denoting that behaviour within the external behaviour, and a memory device arranged as a stack of pointers to behaviours, wherein the apparatus is arranged to establish access to the behaviour within the first module by performing the following steps:

(a) pushing a pointer to the marker onto the stack;

(b) dereferencing the identify link to replace the pointer to the marker with a pointer to the external behaviour; and (c) indexing the external behaviour information to replace the pointer to the external behaviour in the stack with a pointer to the selected behaviour of the first module.

3. Apparatus as claimed in claim 1 further comprising means operable to establish a further identify link between the selected behaviour of the first module and a nominated behaviour within the module containing the marker.

4. A data processing apparatus comprising: means arranged to model a pair of modules with each module comprising a plurality of interconnected elements (behaviours); a further behaviour external to the pair of modules and containing information denoting the behaviours of a first one of the pair of modules; a behaviour within the second of the modules identified as a marker; means for establishing an identify link between the marker and the external behaviour whereby their states are constrained to be the same, such that the marker is able to access a behaviour within the first module via the identify link and from the information denoting that behaviour within the external behaviour, means operable to establish a further identify link between the selected behaviour of the first module and a nominated behaviour within the module containing the marker, and wherein said further identify link is maintained when the identify link between the marker and the external behaviour is terminated.

5. Apparatus as claimed in claim 4, wherein the further identify link is terminated when either of the selected behaviour of the first module or the nominated behaviour of the module containing the marker becomes subject to a subsequently asserted identify link.

6. Apparatus as claimed in claim 1, wherein external behaviour includes a look-up table in which the said information denoting the behaviours of the first module is stored.

7. Apparatus as claimed in claim 2, wherein the means for establishing a link between the marker and the external behaviour is operable to establish a point-to-point link via one or more further behaviours by asserting successive identify links between each, and the dereferencing at step (b) comprises successively replacing pointers of the linked behaviours until the pointer to the external behaviour is arrived at.

* * * * *